(12) United States Patent
Aronstein et al.

(10) Patent No.: US 11,551,347 B2
(45) Date of Patent: Jan. 10, 2023

(54) DEVICES, SYSTEMS, AND METHODS OF GENERATING AND PROVIDING A TARGET TOPOGRAPHIC MAP FOR FINISHING A PHOTOMASK BLANK SUBJECT TO FUNCTIONAL REQUIREMENTS ON FLATNESS

(71) Applicant: CORNING INCORPORATED, Corning, NY (US)

(72) Inventors: David L Aronstein, Rochester, NY (US); Katherine Nicole Ballman, Fairport, NY (US); Christopher Alan Lee, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 294 days.

(21) Appl. No.: 17/030,625

(22) Filed: Sep. 24, 2020

(65) Prior Publication Data
US 2021/0097676 A1    Apr. 1, 2021

Related U.S. Application Data

(60) Provisional application No. 62/906,828, filed on Sep. 27, 2019.

(51) Int. Cl.
*G06T 7/00* (2017.01)
*G06T 7/40* (2017.01)
(Continued)

(52) U.S. Cl.
CPC .............. *G06T 7/0008* (2013.01); *G03F 1/22* (2013.01); *G03F 1/82* (2013.01); *G06T 7/40* (2013.01);
(Continued)

(58) Field of Classification Search
CPC ......... G06T 7/0008; G06T 7/40; G06T 17/30; G06T 2207/30148; G06T 2207/20081;
(Continued)

(56) References Cited

U.S. PATENT DOCUMENTS

2005/0246148 A1    11/2005  Levitan et al.
2011/0189595 A1*    8/2011  Tanabe ................... C03C 19/00
                                                             430/5
(Continued)

FOREIGN PATENT DOCUMENTS

JP      2017-111371 A      6/2017
JP      2017-181731 A     10/2017

OTHER PUBLICATIONS

Aronstein et al., "Functional flatness impact targets (Key Performance Indicators) for the high-volume manufacturing of EUV photomask blanks", Proceedings vol. 11178, Photomask Japan 2019.
(Continued)

*Primary Examiner* — Amandeep Saini

(57) ABSTRACT

Devices, systems, and methods of generating and providing a target topographic map for finishing a photomask blank are disclosed. A method includes receiving topographic data corresponding to an uncompleted photomask blank, receiving functional specifications for flatness of an acceptable photomask blank, and generating the target topographic map for first and/or second major surfaces of the blank, which provides instructions for removing material from the first and/or second major surfaces such that the first and second major surfaces achieve a flatness that passes each functional specification. The amount of material removed reflects a reduction in material necessary to pass the functional specifications. The method further includes transmitting the target topographic map to the finishing device to utilize a finishing technique to implement changes to the photomask blank
(Continued)

according to the target topographic map by removing the material from the photomask blank to achieve a photomask blank that passes the functional specifications.

20 Claims, 5 Drawing Sheets

(51) Int. Cl.
    *G06T 17/30*      (2006.01)
    *G06V 10/46*      (2022.01)
    *G03F 1/22*      (2012.01)
    *G03F 1/82*      (2012.01)

(52) U.S. Cl.
    CPC ............ *G06T 17/30* (2013.01); *G06V 10/473* (2022.01); *G06T 2207/30148* (2013.01)

(58) Field of Classification Search
    CPC ... G06T 7/001; G03F 1/22; G03F 1/82; G03F 1/60; G06V 10/473
    See application file for complete search history.

(56) References Cited

U.S. PATENT DOCUMENTS

2017/0248841 A1    8/2017   Tanabe
2018/0096905 A1*   4/2018   Burns .................... H01L 22/20

OTHER PUBLICATIONS

Ballman et al., "Error analysis of overlay compensation methodologies and proposed functional tolerances for EUV photomask flatness", Proc. SPIE 9984 99840S (2016).
Ballman et al., "Evaluation of photomask flatness compensation for extreme ultraviolet lithography", Proc. of SPIE vol. 9985, 2016, 10 pages.
Griewank et al., "Evaluating Derivatives: Principles and Techniques of Algorithmic Differentiation, Second Edition", 2008.
International Search Report and Written Opinion of the International Searching Authority; PCT/US2020/051146; dated Dec. 30, 2020; 10 Pages; European Patent Office.
Turley et al., "EUV mask flatness compensation strategies and requirements for reticle flatness, scanner optimization and E-beam writer (Conference Presentation)", Proceedings Paper, Proc. SPIE 10450, International Conference on Extreme Ultraviolet Lithography 2017, 104500A.

* cited by examiner

DEVICES, SYSTEMS, AND METHODS OF GENERATING AND PROVIDING A TARGET TOPOGRAPHIC MAP FOR FINISHING A PHOTOMASK BLANK SUBJECT TO FUNCTIONAL REQUIREMENTS ON FLATNESS

CROSS REFERENCE TO RELATED APPLICATION

This application claims the benefit of priority under 35 U.S.C. § 120 of U.S. Application Ser. No. 62/906,828 filed on Sep. 27, 2019 the content of which is relied upon and incorporated herein by reference in its entirety.

BACKGROUND

Field

The present disclosure generally relates to determining one or more locations and/or one or more amounts of material to be removed from a photomask blank such that the photomask blank passes functional specifications for flatness. In particular, the present disclosure is directed to devices, systems, and methods that analyze topographic data of a photomask blank and determine one or more particular locations and/or one or more particular amounts of material to be removed that result in the photomask blank having a particular flatness targeted for extreme ultraviolet (EUV) semiconductor photolithography that minimizes an amount of time and/or other resources in removing the material.

Technical Background

Photomasks are used during EUV semiconductor photolithography to form features on the semiconductors. To ensure proper forming of the features and the proper location of these features on the semiconductor, it is necessary to have photomask blank that is sufficiently flat. Currently, ensuring a sufficiently flat photomask blank is typically an iterative process whereby the photomask blank is polished, measured (e.g., imaged), and evaluated to determine whether it is sufficiently flat, repeating the polishing and imaging processes as many times as necessary to ensure a sufficiently flat photomask blank. Such an iterative process is time consuming, costly, and taxing on resources.

SUMMARY

In a first aspect A1, a method of generating a target topographic map for a finishing device to use on a photomask blank includes receiving, by a processing device, topographic data corresponding to an uncompleted photomask blank. The topographic data includes an imaged topography of a first major surface of the uncompleted photomask blank and an imaged topography of a second major surface of the uncompleted photomask blank. The method further includes receiving, by the processing device, data corresponding to one or more functional specifications for flatness of an acceptable completed photomask blank. The method further includes generating, by the processing device, the target topographic map for at least one of the first major surface and the second major surface based on the topographic data and the data corresponding to the one or more functional specifications for flatness of the acceptable completed photomask blank. The target topographic map provides instructions for removing an amount of material from at least one of the first major surface and the second major surface of the uncompleted photomask blank such that the first major surface and the second major surface achieve a flatness that passes each of the one or more functional specifications for flatness. The amount of material removed reflects a reduction in an amount of material necessary to pass the one or more functional specifications. The method further includes transmitting, by the processing device, the target topographic map to the finishing device such that the finishing device utilizes a finishing technique to implement changes to the uncompleted photomask blank according to the target topographic map by removing the amount of material from the uncompleted photomask blank to achieve a completed photomask blank that passes each of the one or more functional specifications for flatness.

A second aspect A2 includes the method of first aspect A1, further including, after transmitting the target topographic map, receiving, by the processing device, second topographic data of the completed photomask blank, determining, by the processing device, whether the second topographic data of the completed photomask blank passes each of the one or more functional specifications for flatness, and transmitting, by the processing device, data corresponding to whether the second topographic data of the completed photomask blank passes each of the one or more functional specifications for flatness and the target topographic map to a storage device.

A third aspect A3 includes the method of any one of first-second aspects A1-A2, further including converting, by the processing device, the topographic data into a plurality of parameters in a parameter space.

A fourth aspect A4 includes the method of third aspect A3, wherein generating the target topographic map includes utilizing a local optimization algorithm to generate the target topographic map.

A fifth aspect A5 includes the method of fourth aspect A4, wherein utilizing the local optimization algorithm includes determining, by the processing device, a gradient of each of the one or more functional specifications with respect to the plurality of parameters, traversing, by the processing device, the parameter space in a direction relating to the gradient until a state that satisfies the one or more functional specifications is found, and generating, by the processing device, the target topographic map such that the target topographic map reflects a difference between the state and a current state of the uncompleted photomask blank.

A sixth aspect A6 includes the method of fifth aspect A5, wherein determining the gradient includes repeatedly evaluating the one or more functional specifications while systematically introducing changes to each parameter of the plurality of parameters.

A seventh aspect A7 includes the method of any one of first-third aspects A1-A3, wherein generating the target topographic map includes utilizing an optimization algorithm to generate the target topographic map.

An eighth aspect A8 includes the method of seventh aspect A7, wherein utilizing the optimization algorithm includes determining, by the processing device, a target surface profile of each of the first major surface and the second major surface via a lookup of a database including a plurality of target surface profiles and generating, by the processing device, the target topographic map such that the target topographic map corresponds to the target surface profile of each of the first major surface and the second major surface.

A ninth aspect A9 includes the method of seventh aspect A7, wherein utilizing the optimization algorithm includes receiving, by the processing device, one or more specifications of the first major surface and the second major surface from a map generation device trained to determine differences between a compliant photomask blank state and an uncompliant photomask blank state and determine a most compliant state, wherein the most compliant state is a state that minimizes an amount of time and resources needed to finish the uncompleted photomask blank and generating, by the processing device, the target topographic map such that the target topographic map corresponds to the one or more specifications.

A tenth aspect A10 includes the method of any one of first-ninth aspects A1-A9, wherein the target topographic map includes a buffer corresponding to an amount of extra material that, if removed from at least one of the first major surface and the second major surface of the uncompleted photomask blank, increases a likelihood that the uncompleted photomask blank can be made compliant with the functional specifications with a single iteration of deterministic polishing.

An eleventh aspect A11 includes the method of tenth aspect A10, wherein the buffer is determined by a map generation device trained to determine a mismatch between material intended to be removed and material removed in practice from a particular type of finishing device.

A twelfth aspect A12 includes the method of any one of first-eleventh aspects A1-A11, wherein receiving the topographic data corresponding to the uncompleted photomask blank includes receiving one or more pointwise parameters describing a state of the uncompleted photomask blank.

A thirteenth aspect A13 includes the method of any one of first-eleventh aspects A1-A11, wherein receiving the topographic data corresponding to the uncompleted photomask blank includes receiving one or more polynomial parameters, the one or more polynomial parameters including one or more height measurements fit to two-dimensional polynomials comprising a domain corresponding to an active area of the uncompleted photomask blank.

A fourteenth aspect A14 includes the method of any one of first-eleventh aspects A1-A11, wherein receiving the topographic data corresponding to the uncompleted photomask blank includes receiving one or more height measurements fit to a plurality of two-dimensional functions including sines and cosines that are periodic over each dimension of an active area of the uncompleted photomask blank.

A fifteenth aspect A15 includes the method of any one of first-fourteenth aspects A1-A14, wherein receiving the topographic data includes receiving the topographic data from a surface metrology instrument.

A sixteenth aspect A16 includes the method of any one of the first-fifteenth aspects A1-A15, wherein the data corresponding to the one or more functional specifications for flatness of the acceptable completed photomask blank are promulgated by a body that determines an acceptable flatness of particular photomask blanks.

In a seventeenth aspect A17, a photomask blank analyzer includes a processing device and a non-transitory, processor-readable storage medium including one or more programming instructions stored thereon. The programming instructions, when executed, cause the processing device to receive topographic data corresponding to an uncompleted photomask blank, the topographic data including an imaged topography of a first major surface of the uncompleted photomask blank and an imaged topography of a second major surface of the uncompleted photomask blank. The programming instructions, when executed, further cause the processing device to receive data corresponding to one or more functional specifications for flatness of an acceptable completed photomask blank. The programming instructions, when executed, further cause the processing device to generate a target topographic map for at least one of the first major surface and the second major surface based on the topographic data and the data corresponding to the one or more functional specifications for flatness of the acceptable completed photomask blank. The target topographic map provides instructions for removing an amount of material from at least one of the first major surface and the second major surface of the uncompleted photomask blank such that the first major surface and the second major surface achieve a flatness that passes each of the one or more functional specifications for flatness. The amount of material removed reflects a reduction in an amount of material necessary to pass the one or more functional specifications. The programming instructions, when executed, further cause the processing device to transmit the target topographic map to a finishing device such that the finishing device utilizes a finishing technique to implement changes to the uncompleted photomask blank according to the target topographic map by removing the amount of material from the uncompleted photomask blank to achieve a completed photomask blank that passes each of the one or more functional specifications for flatness.

An eighteenth aspect A18 includes the photomask blank analyzer of the seventeenth aspect A17, wherein the one or more programming instructions, when executed, further cause the processing device to receive second topographic data of the completed photomask blank, determine whether the second topographic data of the completed photomask blank passes each of the one or more functional specifications for flatness, transmit data corresponding to whether the second topographic data of the completed photomask blank passes each of the one or more functional specifications for flatness and the target topographic map to a storage device.

A nineteenth aspect A19 includes the photomask blank analyzer of any one of the seventeenth-eighteenth aspects A17-A18, wherein the one or more programming instructions, when executed, further cause the processing device to convert the topographic data into a plurality of parameters in a parameter space.

A twentieth aspect A20 includes the photomask blank analyzer of the nineteenth aspect A19, wherein the one or more programming instructions, when executed, further cause the processing device to determine a gradient of each of the one or more functional specifications with respect to the plurality of parameters, traverse the parameter space in a direction corresponding to the gradient until a state that satisfies the one or more functional specifications is found, and generate the target topographic map such that the target topographic map reflects a difference between the state and a current state of the uncompleted photomask blank.

A twenty first aspect A21 includes the photomask blank analyzer of any one of the seventeenth-twentieth aspects A19-A20, wherein the one or more programming instructions, when executed, further cause the processing device to determine a target surface profile of each of the first major surface and the second major surface via a lookup of a database comprising a plurality of target surface profiles and generate the target topographic map such that the target topographic map corresponds to the target surface profile of each of the first major surface and the second major surface.

A twenty second aspect A22 includes the photomask blank analyzer of any one of the seventeenth-twenty first aspects A17-A21, wherein the one or more programming instructions, when executed, further cause the processing device to receive one or more specifications of the first major surface and the second major surface from a map generation device trained to determine differences between a compliant photomask blank state and an uncompliant photomask blank state and determine a most compliant state, wherein the most compliant state is a state that reduces an amount of time and resources needed to finish the uncompleted photomask blank and generate the target topographic map such that the target topographic map corresponds to the one or more specifications.

A twenty third aspect A23 includes the photomask blank analyzer of any one of the seventeenth-twenty second aspects A17-A22, wherein the target topographic map includes a buffer corresponding to an amount of extra material that, if removed from at least one of the first major surface and the second major surface of the uncompleted photomask blank, increases a likelihood that the uncompleted photomask blank can be made compliant with the functional specifications with a single iteration of deterministic polishing.

A twenty fourth aspect A24 includes the photomask blank analyzer of the twenty third aspect A23, wherein the buffer is determined by a map generation device trained to determine a mismatch between material intended to be removed and material removed in practice from a particular type of finishing device.

In a twenty fifth aspect A25, a system for processing photomask blanks includes a measuring device, a finishing device, and a photomask blank analyzer communicatively coupled to the measurement device and the finishing device. The photomask blank analyzer is configured to receive topographic data corresponding to an uncompleted photomask blank from the measuring device. The topographic data includes an imaged topography of a first major surface of the uncompleted photomask blank and an imaged topography of a second major surface of the uncompleted photomask blank. The photomask blank analyzer is further configured to receive data corresponding to one or more functional specifications for flatness of an acceptable completed photomask blank. The photomask blank analyzer is further configured to generate a target topographic map for at least one of the first major surface and the second major surface based on the topographic data and the data corresponding to the one or more functional specifications for flatness of the acceptable completed photomask blank. The target topographic map provides instructions for removing an amount of material from at least one of the first major surface and the second major surface of the uncompleted photomask blank such that the first major surface and the second major surface achieve a flatness that passes each of the one or more functional specifications for flatness. The amount of material removed reflects a reduction in an amount of material necessary to pass the one or more functional specifications. The photomask blank analyzer is further configured to transmit the target topographic map to the finishing device. The finishing device utilizes a finishing technique to implement changes to the uncompleted photomask blank according to the target topographic map by removing the amount of material from the uncompleted photomask blank to achieve a completed photomask blank that passes each of the one or more functional specifications for flatness.

A twenty sixth aspect A26 includes the system of twenty fifth aspect A25, further including a database server communicatively coupled to the photomask blank analyzer, the database server including the data corresponding to the one or more functional specifications for flatness of the acceptable completed photomask blank.

A twenty seventh aspect A27 includes the system of twenty fifth aspect A25, further including a database server communicatively coupled to the photomask blank analyzer, the database server including a plurality of target surface profiles.

A twenty eighth aspect A28 includes the system of twenty seventh aspect A27, wherein the photomask blank analyzer is further configured to determine a target surface profile of each of the first major surface and the second major surface via a lookup of the plurality of target surface profiles and generate the target topographic map such that the target topographic map corresponds to the target surface profile of each of the first major surface and the second major surface.

A twenty ninth aspect A29 includes the system of any one of twenty fifth-twenty eighth aspects A25-A28, further comprising a map generation device communicatively coupled to the photomask blank analyzer, the map generation device trained to determine differences between a compliant photomask blank state and an uncompliant photomask blank state and determine a most compliant state, the most compliant state being a state that minimizes an amount of time and resources needed to finish the uncompleted photomask blank.

A thirtieth aspect A30 includes the system of the twenty ninth aspect A29, wherein the photomask blank analyzer is further configured to receive one or more specifications of the first major surface and the second major surface from the map generation device and generate the target topographic map such that the target topographic map corresponds to the one or more specifications.

A thirty first aspect A31 includes the system of any one of twenty fifth-twenty eighth aspects A25-A28, further including a map generation device communicatively coupled to the photomask blank analyzer, the map generation device trained to determine amounts of extra material typically removed from a particular type of finishing device.

A thirty second aspect A32 includes the system of any one of twenty fifth-thirty first aspects A25-A31, wherein generating the target topographic map further includes receiving information from the map generation device and generating the target topographic map with a buffer corresponding to an amount of extra material that, if removed from at least one of the first major surface and the second major surface of the uncompleted photomask blank, increases a likelihood that the uncompleted photomask blank can be made compliant with the functional specifications with a single iteration of deterministic polishing based on the information received from the map generation device.

Additional features and advantages of the devices, systems, and methods for generating and providing a map for finishing a photomask blank will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The embodiments set forth in the drawings are illustrative and exemplary in nature and are not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
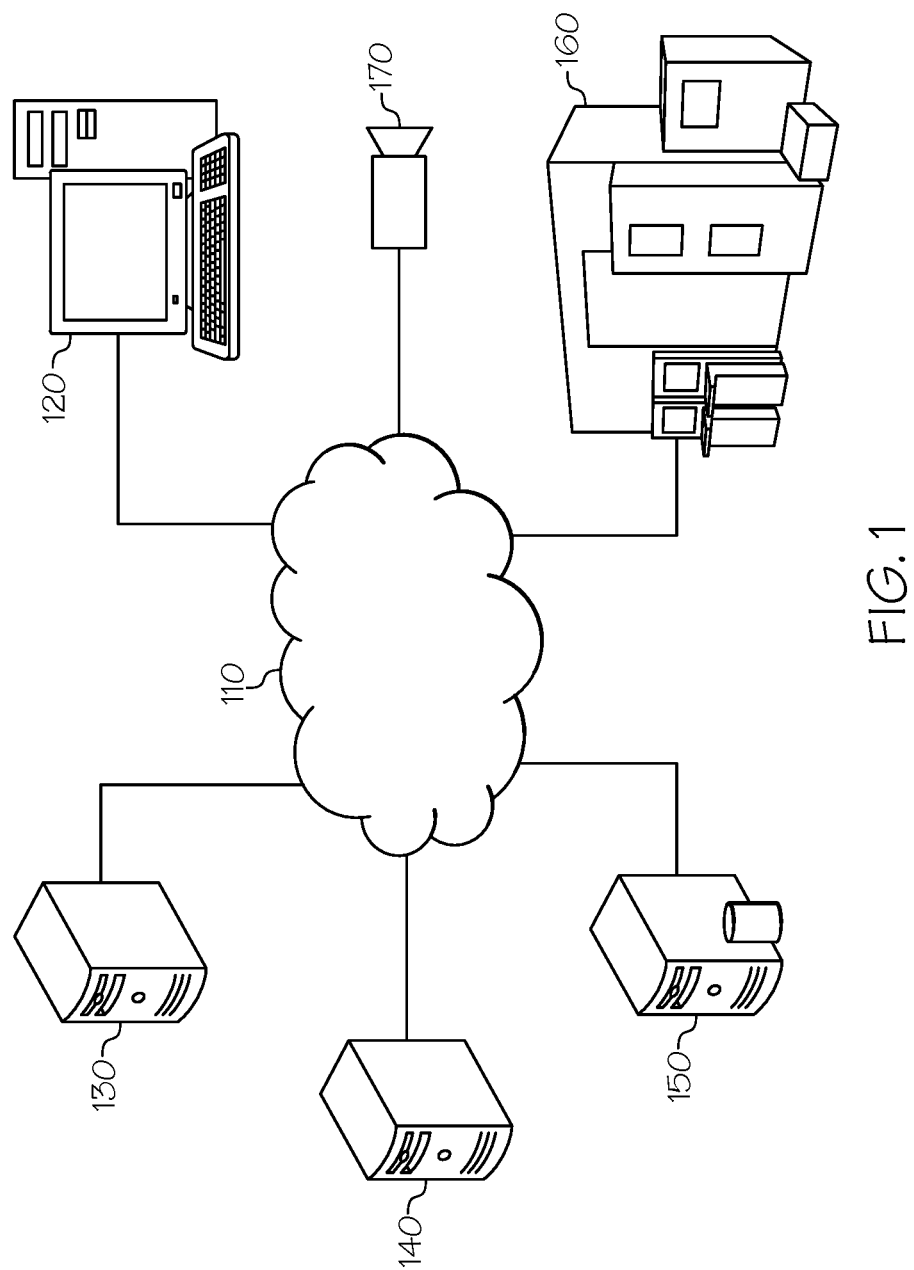
FIG. 1 schematically depicts an illustrative network of devices and systems for generating and providing a target topographic map according to one or more embodiments shown and described herein.

Referring generally to the figures, embodiments of the present disclosure are related to devices, systems, and methods of generating a target topographic map that is usable by a finishing device to finish a photomask blank such that the photomask blank is sufficiently flat according to one or more functional specifications, while at the same time minimizing the amount of time and/or other resources necessary to finish the photomask blank. That is, the devices, systems, and methods described herein receive topographic data of an uncompleted photomask blank, generate the target topographic map that will result in the uncompleted photomask blank achieving a particular flatness that meets the one or more functional specifications, and transmit the target topographic map to a finishing device for removing material according to the target topographic map to achieve a completed photomask blank.

After generating a target topographic map that offers improved amounts of time and/or other resources necessary to finish the photomask blank, the devices, systems, and methods described herein may add in an optional buffer to the target topographic map. The buffer adds a small amount of extra removal of material to the target topographic map in order to increase the probability that the polishing process will successfully transform the uncompleted photomask blank into a competed photomask blank after a single polishing iteration. That is, the devices, systems, and methods described herein are adapted to avoid a plurality of processing iterations to minimize the amount of time and/or other resources needed to complete a photomask blank.

The devices, systems, and methods described herein generally do not use an iterative process. That is, only a single material removal process is necessary to achieve the completed photomask blank from the uncompleted photomask blank when using the target topographic map. Thus, the time and expense that is typically necessary for iterating in order to complete a photomask blank is avoided.

Semiconductor photolithography is a process in which semiconductor integrated circuits (ICs) are manufactured. Examples of integrated circuits are central processing units (CPUs) in computers, graphics processing units (GPUs) in computer graphics cards, and the primary electronics that enable smart phones, smart televisions, and a wide range of other consumer and industrial electronics. The standard process for manufacturing ICs uses light having wavelengths in the ultraviolet portion of the electromagnetic spectrum. In some embodiments, lithography processes may use light having a wavelength of about 193 nanometers (nm) (hereinafter, "193 nm lithography"). ICs may include one or more complex patterns of transistors, connected with wires, created on a semiconductor substrate. Some ICs may have tens of millions of transistors per square millimeter, and increases in the density of transistors may enable faster and more energy efficient ICs.

One step in IC manufacturing involves passing ultraviolet light through a photomask, which contains patterns that are related to the wires and transistors that are to be created in the IC. The patterns on the photomasks are larger than the transistors desired to be created in the IC. The patterns on the photomasks may be 4 to 8 times larger than the desired pattern in the IC. Such a reduction may be completed by a scanner system during exposure. A precursor to creating a photomask is having a sufficiently flat photomask blank onto which the desired patterns can be etched. The present disclosure involves the fabrication of photomask blanks and specifically the issue of what constitutes "sufficiently flat" in order for a photomask blank to become a successfully performing photomask in photolithography.

Photomask blanks are made using a glass or crystalline substrate, manufactured in boules by material manufacturers. The photomask blanks are cut from the boules and processed by blank polishers. This processing involves creating the nominal blank geometry, such, as, for example, 6 inch by 6 inch by 0.25 inch blanks, called a "6025 photomask blank," and then polishing the major surfaces thereof (e.g., the front and back surfaces) to a required flatness and/or thickness variation, using what is referred to as conventional and/or deterministic polishing or finishing. The photomask blanks are coated with films and photoresist, which are used to create the patterning. For some photomasks, the films may include a chromium (Cr) layer and a photoresist layer to create opaque regions and clear regions after patterning. For EUV photomasks, a complex film stack may be used, such as, for example, 40 layer Molybdenum (Mo)/Silicon (Si) alternating reflective coating, Ruthenium (Ru) capping layer, absorber layer, and photoresist. The photomask blanks are exposed in electron-beam write tools to create the pattern, and then developed, etched, inspected, and repaired, thus creating the finished photomasks by companies colloquially called mask shops. The ICs themselves are manufactured (using photomasks) in machines called scanners or steppers, in facilities colloquially called fabs.

In 193 nm lithography, the specification of flatness is that the total indicated runout (TIR) of the photomask blanks, the distance, perpendicular to the mask surface, from the highest point to the lowest point on the photomask surface, must be within a specified range. A stringent photomask flatness requirement for 193 nm lithography may be about 100 nm or more TIR over a specific sub-region of the photomask blank surface. A key point is that a particular photomask can be checked to see if it was manufactured within this flatness specification using direct measurements from a surface metrology instrument, such as, for example, the Tropel® UltraFlat™ photomask form analysis system (Corning Tropel Corporation, Fairport N.Y.).

Photomask fabrication, like many other forms of optical and opto-mechanical fabrication, may be an iterative process. After the first step in photomask fabrication, using a process generally called conventional polishing, a photomask blank may not yet meet a corresponding TIR flatness specification. In order to go from the initially-created photomask to one that is acceptable for use in photolithography, one or more additional finishing steps (using a technique generally called deterministic polishing) may be required. The process of improving the flatness of a photomask may proceed as follows: (1) measurements of the existing first and second major surfaces of the photomask are made using an instrument such as the Tropel® UltraFlat™ photomask form analysis system (Corning Tropel Corporation, Fairport N.Y.); (2) the measurements are compared with the specifications for an acceptable photomask; (3) a plan or map (e.g., a target topographic map) is created, of particular areas of the photomask where material would need to be removed from the existing front and/or back surfaces in order to make the photomask within specification and acceptable for use; and (4) an attempt to implement the target topographic map is completed by removing material from the photomask surfaces using a deterministic finishing technique, such as magnetorheological finishing (MRF) or ion-beam milling. It should be understood that this process may be imperfect, and there may be some difference between the intended and actual changes made to a surface. For this reason, steps (1)-(4) may need to be repeated one or more times before an acceptable photomask blank is achieved (e.g., a photomask blank that passes flatness requirements).

It should be understood that the term "target topographic map" may not be uniquely defined, as a plurality of changes to the photomask blank surfaces exist that, when implemented using a deterministic finishing technique, would make a photomask blank acceptable for use in a photolithography application. The present disclosure includes devices, systems, and methods that generate target topographic maps that are optimized for the time and/or resources needed to bring a photomask blank into meeting thickness specifications (e.g., minimizing an amount of time and/or resources).

The photomask-blank thickness specifications for use in EUV lithography may be more complex than the specifications for use in 193 nm lithography. This increased complexity originates from the current practice that the 13.5 nm light used in EUV lithography is steered and focused using mirrors (e.g., utilizing the law of reflection) rather than using lenses (e.g., utilizing the law of refraction), and mirror-based systems may have some complications. For example, the EUV lithography systems lack telecentricity, which is present in 193 nm lithography systems. That is, precise image placement and precise control over image magnification are important for photolithography optical systems. Optical systems that are telecentric (specifically either image-space telecentric or doubly telecentric, in both object-space and image-space) have the property that their image magnification does not change when either the optical system's focus is adjusted or when the optical system is operated slightly out of focus. In EUV photolithography systems that are not telecentric, it becomes much more important to achieve the nominal focus target, because otherwise there is also a change in magnification that is further detrimental to operation. The fact that EUV lithography systems are non-telecentric implies that the photomask performance is sensitive to its position and orientation in the lithography system. This sensitivity has a consequence that the exact nature of the non-flatness of the mask, beyond a simple TIR specification, has a bearing on whether a given photomask can be used successfully. In another example, the photomasks are held in an EUV photolithography scanning system using electrostatic clamping (ESC) with a pin chuck. This means that an aspect to the flatness of the photomask blank may not be its natural, free state flatness, but rather the thickness variation that results when the photomask is clamped via ESC in the scanner system.

Certain photolithography processes may have transistor feature sizes around 7 nm. Such a processing level may be called a "7 nm node." As the semiconductor photolithography industry has considered EUV lithography processes for the 7 nm node, the factors described herein (e.g., the 13.5 nm wavelength, 7-nm-sized transistors, and the non-telecentricity of the lithography systems) initially led the industry to believe that specifications for photomask blanks would require the control of the thickness and shape of photomask blanks to the <20 nm level for TIR for each major surface of the photomask blank, which would require steep investments of time and resources for the many iterations of refinishing that would generally be needed in order to reach these specifications and which would provide substantial challenges to manufacture in volume. However, this path of tightening photomask thickness requirements for the introduction of EUV lithography at the 7 nm node and then tightening them further with each new transistor-size node was leading to specifications that are unnecessarily cumbersome, both time consuming and expensive, for the suppliers of the needed components and equipment. This simple tightening of requirements was not taking advantage of optimization degrees of freedom available in the steppers where the semiconductor ICs are fabricated. That is, in many instances, a tightening of requirements would create a burden on blank polishers to create a level of precision that is not ultimately needed in situ in the steppers. This situation has led to a discussion in the industry of turning to "functional specifications," which here are quantities that evaluate the performance of the photomask blanks in situ in the steppers, which generally are not easily traceable back to directly measurable quantities that can easily be evaluated by equipment suppliers.

In some embodiments, one or more (e.g., four (4)) functional specifications on photomask blank flatness may be used in EUV lithography. The target values for these one or more functional-specification quantities may depend on the scanning system used and on the size of features (e.g., the size of the transistors) needed for the ICs being fabricated. In this way, a given photomask blank may satisfy functional-specification values for some IC applications but not others, and photomask blanks can be "graded" into a series of "classes" of the smallest transistor size that could be achieved in EUV lithography using each mask. Generally, a photomask blank satisfying a higher class of specification takes more time and resources to manufacture and can be sold for more money in the semiconductor lithography marketplace. As such, there exists a need for creating photomasks consistent with each of the different classes.

The present disclosure includes a class of algorithms for bridging between multiple functional specifications on EUV photomask blank flatness and an optimized target topographic map. That is, the primary goal of the present disclosure is a strategy for how the first and second major surfaces (e.g., the front and back surfaces) of a photomask under manufacture can be reshaped (e.g., using a deterministic polishing process) so that it satisfies the functional specifications for flatness. Each iteration of reshaping the front and back surfaces of a photomask comes with an expenditure of time and resources, so it is not in the interest of a photomask blank polisher to continue working on a photomask blank once it meets its specifications. In that sense, the optimized target topographic map described herein is one in which there is a high degree of likelihood that it will make a photomask blank meet its functional specifications after a single improvement cycle, and finds a target topographic map that is at or near a minimum of the time and/or resources needed to implement. With knowledge of the actual deterministic finishing technique and equipment used by the photomask blank polisher, the devices, systems, and methods described herein may add in a realistic buffer to the target topographic map that accounts for the range of possible gaps between intended surface changes and actual surface changes that can be made in the photomask blanks during the deterministic finishing process. The data used to provide the target topographic map may be improved over time, using techniques from adaptive modeling (e.g., Markov chains or Kalman filtering) and/or from machine learning (e.g., adaptive learning models).

One or more (e.g., four (4)) functional specifications on photomask blank flatness that may be used in EUV lithography may rely on an optomechanical model of (1) how a given photomask blank is held by a pin electrostatic chuck in an EUV scanner and is distorted by this clamping or mounting, (2) the illumination geometry used in the scanner during the photolithography process, (3) the ability to adjust the photomask position and orientation in order to bring it into optimal alignment and focus, and (4) the process-control corrections in the scanner system that can partially or fully compensate for some aspects of the photomask blank non-flatness. Although a method to estimate the numerical values of the functional specifications for flatness (e.g., a program that runs on a computer) may be available to all interested parties, the devices, systems, and methods described herein provide a way for the photomask blank polishers to identify optimized target topographic maps without having to invest personnel and resources in "data mining" these optomechanical models by themselves.

Referring now to the figures, FIG. 1 schematically depicts an illustrative network, generally designated 110, of devices and systems for generating and providing a target topographic map. As illustrated in FIG. 1, the network 110 may include a wide area network (WAN), such as the Internet, a local area network (LAN), a mobile communications network, a public service telephone network (PSTN), a personal area network (PAN), a metropolitan area network (MAN), a virtual private network (VPN), and/or another network. The network 110 may generally be configured to electronically connect one or more systems and/or devices such as, for example, computing devices, measuring devices, finishing devices, and/or components of any of the foregoing. Illustrative systems and/or devices may include, but are not limited to, a user computing device 120, a photomask blank analyzer 130, a map generation device 140, a database server 150, a finishing device 160, and/or a measuring device 170.

The user computing device 120 may generally be used as an interface between a user and the other components connected to the network 110. Thus, the user computing device 120 may be used to perform one or more user-facing functions, such as receiving one or more inputs from a user or providing information to the user, as described in greater detail herein. Accordingly, the user computing device 120 may include at least a display and/or input hardware. In the event that any of the other devices connected to the network 110 (e.g., the photomask blank analyzer 130, the map generation device 140, the database server 150, the finishing device 160, and/or the measuring device 170), requires oversight, updating, and/or correction, the user computing device 120 may be configured to provide the desired oversight, updating, and/or correction. The user computing device 120 may also be used to input data into a corpus of data stored in a storage device. For example, the user computing device 120 may contain software programming or the like that allows a user to provide information pertaining to topographic data from the major surfaces of a photomask blank, provide information pertaining to functional specifications, view topographic data, view information pertaining to functional specifications, and/or the like.

The photomask blank analyzer 130 may generally receive data from one or more sources (e.g., the photomask blank analyzer 130, the map generation device 140, the database server 150, the finishing device 160, and/or the measuring device 170), analyze the received data, generate data, store data, index data, search data, and/or provide data to one or more components (e.g., the user computing device 120, the map generation device 140, the database server 150, the finishing device 160, and/or the measuring device 170). In one particular nonlimiting example, the photomask blank analyzer 130 may receive topographic data from one or more sources, receive data corresponding to one or more functional specifications from one or more sources, generate a target topographic map according to the topographic data and the data corresponding to the functional specifications, and transmit the target topographic map to one or more destinations. Additional details regarding the operation of the photomask blank analyzer 130 and the various components thereof for carrying out the operations will be described in greater detail herein.

The map generation device 140 is generally a computing device (or a network of computing devices) that stores one or more optimization and/or machine learning algorithms thereon and are particularly configured to function in conjunction with the photomask blank analyzer 130 to determine a target topographic map, determine an amount of buffer necessary, and/or the like, as described herein. The machine learning algorithms utilized by the map generation device 140 are not limited by the present disclosure, and may generally be any algorithm now known or later developed, particularly those that are specifically adapted for generating a predictive model that can be used for generating a target topographic map. That is, the machine learning algorithms may be supervised learning algorithms, unsupervised learning algorithms, semi-supervised learning algorithms, and reinforcement learning algorithms. Specific examples of machine learning algorithms may include, but are not limited to, nearest neighbor algorithms, naïve Bayes algorithms, decision tree algorithms, linear regression algorithms, support vector machines, neural networks, clustering algorithms, association rule learning algorithms, Q-learning algorithms, temporal difference algorithms, and deep adversarial networks. Other specific examples of machine learning algorithms used by the map generation device 140 should generally be understood and are included within the scope of the present disclosure.

The database server 150 is generally a repository of data that is used for the purposes of generating a target topographic map as described herein. That is, the database server 150 may contain one or more storage devices for storing data pertaining to topographic data, data pertaining to functional specifications, and/or the like. The database server 150 may be accessible by one or more other devices and/or systems coupled to the network 110 and may provide the data as needed. For example, the database server 150 may provide data pertaining to functional specifications to the photomask blank analyzer 130 and/or the map generation device 140 that is used by the photomask blank analyzer 130 and/or the map generation device 140 to generate a target topographic map, as described in greater detail herein.

It should be understood that while the user computing device 120 is depicted as a personal computer and the photomask blank analyzer 130, the map generation device 140, and the database server 150 are each depicted as a server, these are nonlimiting examples. In some embodiments, any type of computing device (e.g., mobile computing device, personal computer, server, cloud-based network of devices, etc.) or specialized electronic device may be used for any of these components. Additionally, while each of these computing devices is illustrated in FIG. 1 as a single piece of hardware, this is also merely an example. Each of the user computing device 120, the photomask blank analyzer 130, the map generation device 140, and the database server 150 may represent a plurality of computers, servers, databases, components, and/or the like.

The finishing device 160 is generally a device that is particularly configured to remove material from photomask blanks based on a target topographic map that is provided by the photomask blank analyzer 130. The finishing device 160 is otherwise not limited by the present disclosure, and can be any finishing device. In some embodiments, the finishing device 160 may be an electron beam lithography system, such as, for example, those available from JEOL USA, Inc. (Peabody Mass.) and Raith GmbH (Dortmund, Germany). In other embodiments, the finishing device 160 may be an ultra-precision polishing device such as those available from Zeeko Ltd. (Coalville, United Kingdom)

The measuring device 170 is a particularly configured device that obtains a precise flatness measurement of a photomask blank and generates topographic data corresponding to each of the major surfaces (e.g., front and back surfaces) of the photomask blank. This topographic data is usable by the photomask blank analyzer 130 and/or the map generation device 140 for the purposes of generating a target topographic map, as described herein. In some embodiments, the measuring device 170 may be a surface metrology instrument. In some embodiments, the measuring device 170 may use interferometry, such as near-normal incidence interferometry, to measure the photomask blank. An illustrative example of the measuring device 170 is the Tropel® UltraFlat™ photomask form analysis system available from the Corning Tropel Corporation (Fairport N.Y.). Another example of the measuring device 170 is the ZYGO Verifire™ XL laser interferometer (Middlefield Conn.).

While FIG. 1 depicts the various systems and/or components communicatively coupled to one another via the network 110, this is merely illustrative. In some embodiments, various components may be communicatively coupled to one another via a direct connection. In some embodiments, various components may be integrated into a single device. In one nonlimiting example, the photomask blank analyzer 130 and the measuring device 170 may be a single device that is particularly configured to obtain measurements, analyze the measurements, and generate a target topographic map. In another nonlimiting example, the photomask blank analyzer 130, the finishing device 160, and the measuring device 170 may be a single device that is particularly configured to obtain measurements, analyze the measurements, generate a target topographic map, and finish the photomask blank. In yet another nonlimiting example, the photomask blank analyzer 130 and the map generation device 140 may be a single device that is particularly configured to apply one or more machine learning algorithms in generating a target topographic map without communication between individual devices. Other combinations are also contemplated and are included within the scope of the present disclosure.

Figure 2A:
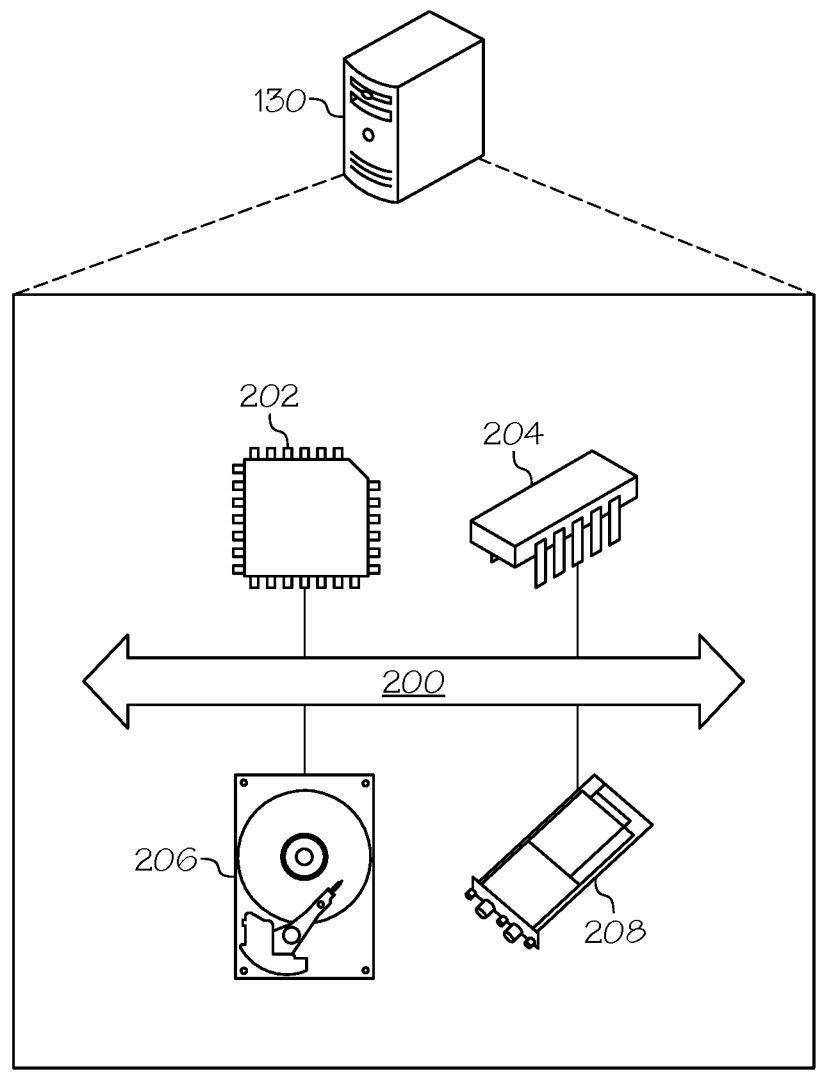
FIG. 2A depicts a block diagram of illustrative internal hardware components of a photomask blank analyzer according to one or more embodiments shown and described herein.

FIG. 2A schematically depicts illustrative internal hardware components of the photomask blank analyzer 130 that may be used in generating a target topographic map according to various embodiments. As illustrated in FIG. 2A, the photomask blank analyzer 130 may include a processing device 202, a non-transitory memory component 204, a storage device 206, and/or network interface hardware 208. A local interface 200, such as a bus or the like, may interconnect the various components.

The processing device 202, such as a computer processing unit (CPU), may be the central processing unit of the photomask blank analyzer 130, performing calculations and logic operations to execute a program. The processing device 202, alone or in conjunction with the other components, is an illustrative processing device, computing device, processor, or combination thereof. The processing device 202 may include any processing component configured to receive and execute instructions (such as from the storage device 206 and/or the non-transitory memory component 204).

The non-transitory memory component 204 may be configured as a volatile and/or a nonvolatile computer-readable medium and, as such, may include random access memory (including SRAM, DRAM, and/or other types of random access memory), read only memory (ROM), flash memory, registers, compact discs (CD), digital versatile discs (DVD), and/or other types of storage components. The non-transitory memory component 204 may include one or more programming instructions thereon that, when executed by the processing device 202, cause the processing device 202 to complete various processes, such as certain processes described herein with respect to FIGS. 3-4. Still referring to FIG. 2A, the programming instructions stored on the non-transitory memory component 204 may be embodied as a plurality of software logic modules, where each logic module provides programming instructions for completing one or more tasks, as described in greater detail below with respect to FIG. 2B.

Still referring to FIG. 2A, the network interface hardware 208 may include any wired or wireless networking hardware, such as a modem, LAN port, wireless fidelity (Wi-Fi) card, WiMax card, long term evolution (LTE) card, mobile communications hardware, and/or other hardware for communicating with other networks and/or devices. For example, the network interface hardware 208 may provide a communications link between the photomask blank analyzer 130 and the other components of the network 110 depicted in FIG. 1, including (but not limited to) the user computing device 120, the map generation device 140, the database server 150, the finishing device 160, and/or the measuring device 170.

Still referring to FIG. 2A, the storage device 206, which may generally be a storage medium, may contain one or more data repositories for storing data that is received and/or generated. The storage device 206 may be any physical storage medium, including, but not limited to, a hard disk drive (HDD), memory, removable storage, and/or the like. While the storage device 206 is depicted as a local device, it should be understood that the storage device 206 may be a remote storage device, such as, for example, a server computing device or the like (e.g., the database server 150 of FIG. 1). Illustrative data that may be contained within the storage device 206 is described below with respect to FIG. 2C.

Figure 2B:
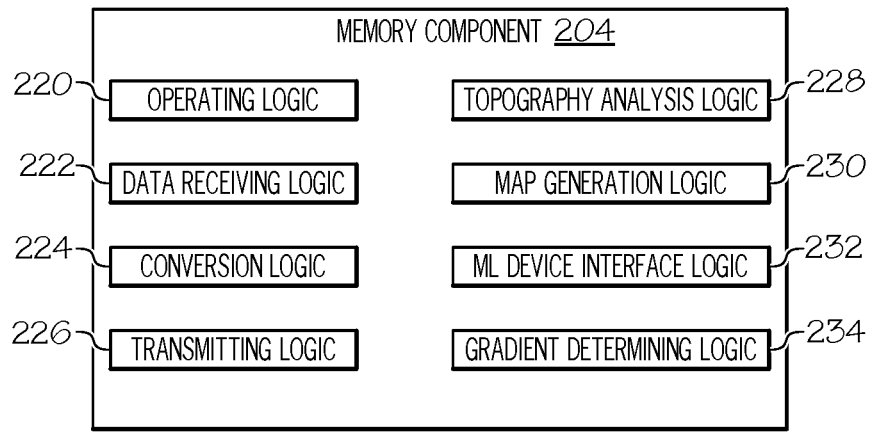
FIG. 2B depicts a block diagram of illustrative logic modules contained within a memory component of a photomask blank analyzer according to one or more embodiments shown and described herein.

In some embodiments, the program instructions contained on the non-transitory memory component 204 may be embodied as a plurality of software modules, where each module provides programming instructions for completing one or more tasks. For example, FIG. 2B schematically depicts the non-transitory memory component 204 containing illustrative logic components according to one or more embodiments shown and described herein. As shown in FIG. 2B, the non-transitory memory component 204 may be configured to store various processing logic, such as, for example, operating logic 220, data receiving logic 222, conversion logic 224, transmitting logic 226, topography analysis logic 228, map generation logic 230, machine learning (ML) device interface logic 232, and/or gradient determining logic 234 (each of which may be embodied as a computer program, firmware, or hardware, as an example).

Referring to FIGS. 2A-2B, the operating logic 220 generally contains programming instructions for providing an operating system and/or other programming instructions for managing components of the photomask blank analyzer 130. That is, the general operation of the photomask blank analyzer 130 is generally governed by the programming instructions contained within the operating logic 220. Further, to the extent that various processes described herein are not attributed to a particular one or more of the other logic modules of the non-transitory memory component 204, such processes may be completed according to programming contained within the operating logic 220.

Still referring to FIGS. 2A-2B, the data receiving logic 222 generally contains programming instructions for obtaining data that is used to carry out the various processes described herein. That is, the data receiving logic 222 may include programming for causing the processing device 202 to direct the network interface hardware 208 to connect to one or more of the components connected to the network 110 (FIG. 1) to obtain data therefrom. Still referring to FIGS. 2A-2B, the data receiving logic may operate to receive data, such as, for example, topographic data, data corresponding to one or more functional specifications, data generated as a result of a machine learning process, data pertaining to buffers, and/or other data. As such, the data receiving logic 222 may include programming instructions that allow for a connection between devices to be established, protocol for requesting data stores containing data, instructions for causing the data to be copied, moved, or read, and/or the like. Accordingly, as a result of operating according to the data receiving logic 222, data and information pertaining to a topography of a photomask blank, functional specifications, machine learning results, and/or buffers is available for completing various other processes, as described in greater detail herein.

The conversion logic 224 generally contains programming instructions for converting data from one form to another. That is, in some embodiments, it may be necessary to convert data from a first form into another form such that it is usable for particular processes. For example, the conversion logic may be used to convert the topographic data of a photomask blank into a plurality of parameters in a parameter space such that the parameters can be used to generate a target topographic map, as described in greater detail herein.

The transmitting logic 226 generally contains programming instructions for providing data to one or more external components. That is, the transmitting logic 226 may include programming for causing the processing device 202 to direct the network interface hardware 208 to output data to one or more external components such as, for example, one or more of the components connected to the network 110 (FIG. 1). As such, the transmitting logic 226 may include programming instructions that allow for a connection between devices to be established, protocol for accessing data stores, instructions for causing the data to be copied, moved, or read, and/or the like. In a particular embodiment, the transmitting logic 226 includes programming for causing the processing device 202 to direct the network interface hardware 208 to output a target topographic map to the finishing device 160 (FIG. 1) such that the finishing device 160 can use a finishing technique to remove material from a photomask blank according to the target topographic map to achieve a completed photomask blank.

Still referring to FIGS. 2A-2B, the topography analysis logic 228 generally contains programming instructions for determining one or more measurements of a major surface of a photomask blank from topographic data (e.g., determining and/or quantifying one or more attributes of a major surface of a photomask blank). That is, the topography analysis logic 228 includes programming instructions that cause the processing device 202 to determine one or more peaks and/or one or more valleys present on a major surface of a photomask blank, determine a height of each of the one or more peaks and/or the one or more valleys, determine a lowest point, determine one or more points that are approximately a lowest point, and/or the like. In some embodiments, a determination of a lowest point and/or a determination of one or more points that are approximately a lowest point may be used to identify a point to be used for achieving a particular flatness, as described in greater detail herein.

The map generation logic 230 generally contains programming instructions for generating a map, particularly a target topographic map. That is, the map generation logic 230 includes programming instructions that cause the processing device 202 to generate a target topographic map based on topographic data and data corresponding to one or more functional specifications of an acceptable photomask blank such that the target topographic map provides information and/or instructions for removing material from each of the major surfaces of a photomask blank to achieve a particular flatness (e.g., a flatness that meets the one or more functional specifications), with the optional use of an added buffer to ensure that the photomask blank has an increased probability of achieving the flatness functional requirements after a single iteration of deterministic polishing.

Referring to FIGS. 1 and 2A-2B, the ML device interface logic 232 generally contains programming instructions for communicating directly with the map generation device 140. That is, the ML device interface logic 232 may include programming for causing the processing device 202 to direct the network interface hardware 208 to connect to the map generation device 140 to transmit and/or receive data. The ML device interface logic 232 may operate to transmit and/or receive data, such as, for example, topographic data, data corresponding to one or more functional specifications, data generated as a result of a machine learning process, data pertaining to buffers, and/or other data. As such, the ML device interface logic 232 may include programming instructions that allow for a connection between the photomask blank analyzer 130 and the map generation device 140 to be established, protocol for requesting data stores containing data, instructions for causing the data to be copied, moved, or read, and/or the like. Accordingly, as a result of operating according to the ML device interface logic 232, data and information pertaining to machine learning results and/or buffer ranges is available for completing various other processes, as described in greater detail herein.

Referring again to FIGS. 2A-2B, the gradient determining logic 234 generally contains programming instructions for using a local optimization methodology that uses partial derivatives of functional specifications with respect to all parameters (e.g., a gradient) as a means of considering a series of possible target topographic maps and then identifying an acceptable solution for the actual target topographic map that is provided to the user. In the local optimization methodology, the programming instructions of the gradient determining logic direct the processing device 202 to proceed through an N-dimensional parameter space of the topographic data in a direction related to the gradient, until it finds a new state of the first major surface and second major surface that would then satisfy all functional specifications. The ideal target topographic map may be a difference between the new state and a present state of the photomask blank surfaces (e.g., an uncompleted state before the photomask blank has undergone a finishing process by the finishing device). Since there may be a plurality of functional specifications, each of which having a gradient with respect to all of the parameters, the actual directions explored can be related to the gradient of each functional specification in turn, or a combination of all of these gradients into a single direction of exploration. The gradients can be computed numerically or analytically. When computed numerically, the functional specifications are evaluated repeatedly, while systematically introducing small changes to each parameter or component in turn. The partial derivative of a functional specification with respect to a given parameter is the change in the specification divided by the change systematically introduced in the parameter. When computed analytically, the partial derivatives of the functional specifications are evaluated with respect to surface parameters, using, for example, reverse-mode algorithmic differentiation.

It should be understood that the logic modules depicted with respect to FIG. 2B are merely illustrative. As such, it should be understood that additional or fewer logic modules may also be included within the non-transitory memory component 204 without departing from the scope of the present disclosure. In addition, certain logic modules may be combined into a single logic module and/or certain logic modules may be divided into separate logic modules in some embodiments.

Figure 2C:
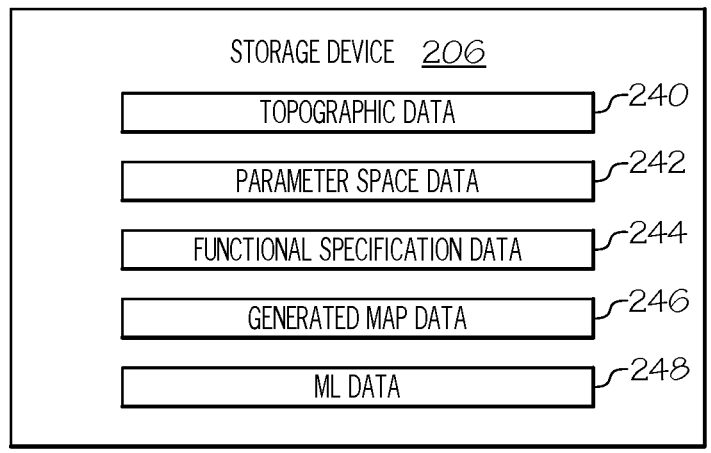
FIG. 2C depicts a block diagram of illustrative data contained within a storage device of a photomask blank analyzer according to one or more embodiments shown and described herein.

FIG. 2C schematically depicts a block diagram of various data contained within a storage device (e.g., the storage device 206) of the photomask blank analyzer 130 (FIG. 2A) according to one or more embodiments shown and described herein. As shown in FIG. 2C, the storage device 206 may include, for example, topographic data 240, parameter space data 242, functional specification data 244, generated map data 246, and/or ML data 248.

Referring to FIGS. 1 and 2C, the topographic data 240 is generally the data that is obtained by the measuring device 170 and transmitted to the photomask blank analyzer 130. However, the present disclosure is not limited to such. For example, the topographic data 240 may be data that is obtained by the photomask blank analyzer 130 from one or more other components, such as, for example, the user computing device 120 and/or the database server 150. The topographic data 240 generally contains images, maps, measurements, and/or other information that can be used to determine, for example, one or more peaks and/or one or more valleys in each of the major surfaces of a photomask blank. In some embodiments, the topographic data 240 may be data that is generated as a result of operation of a surface metrology instrument, such as, for example, the Tropel® UltraFlat™ photomask form analysis system (Corning Tropel Corporation, Fairport N.Y.).

The parameter space data 242 may generally be data that is generated as a result of converting the topographic data 240 into a plurality of parameters in a parameter space. That is, the parameter space data 242 contains information that is used for the purposes of generating a target topographic map via a local optimization methodology that makes use of a gradient, as described in greater detail herein.

The functional specification data 244 is generally data that pertains to functional specifications. Functional specifications consider how multiple, possibly complex and/or interdependent, factors contribute to a quantity of interest. In contrast, traditional specifications look at each quantity of interest in isolation; the difference between functional specifications and traditional specifications is that traditional specifications may be more restrictive because they do not properly account for possible synergies and influences from other factors. For the specific case of functional specifications for EUV photomask blank flatness, an illustrative description of functional specifications and/or data pertaining to the functional specifications is provided in "EUV mask specifications—Future changes for consideration" by John Zimmerman, Drew Chieda, Wouter Elings, Robert de Kruif, Hamid Joni, Leon Levasier, Eric Monkman, and Jack van der Sanden, and presented at the Photomask Japan 2019 conference, Yokohama Japan, 18 Apr. 2019, the contents of which are incorporated herein by reference. Additional analysis and comparisons between functional and traditional flatness specifications are provided in "Functional Flatness Impact Targets (Key Performance Indicators) for the High-Volume Manufacturing of EUV Photomask Blanks" by David Aronstein, Katherine Ballman, Christopher Lee, and John Zimmerman, published in Proceedings of SPIE Volume 11178, Photomask Japan 2019: XXVI Symposium on Photomask and Next-Generation Lithography Mask Technology; 111780H (2019) https://doi.org/10.1117/12.2537390, the contents of which is incorporated herein by reference.

The generated map data 246 is generally data that results from the generation of a target topographic map according to the various embodiments described herein. That is, the generated map data 246 contains information that is based on the topographic data 240 and/or the functional specification data 244 and contains information or instructions relating to removal of an amount of material from a particular photomask blank such that the major surfaces of the particular photomask blank achieve a flatness that meets functional specifications, as described herein. In some embodiments, a buffer is added to the target topographic map to increase the probability that the blank will achieve the functional flatness specifications in a single iteration of deterministic polishing. Also in some embodiments, the generated map data 246 may also include information that was generated as a result of an analysis and/or application of the parameter space data 242, as described herein.

Referring to FIGS. 1 and 2C, the ML data 248 is generally data that is generated as a result of one or more machine learning processes. That is, the ML data 248 is data generated as a result of operation of the map generation device 140. Accordingly, the ML data 248 may include data pertaining to parameters for a target topographic map generated as a result of a machine learning analysis of the topographic data 240, the functional specification data 244, and/or the like, data pertaining to parameters for a buffer range generated as a result of a machine learning analysis, and/or the like.

It should be understood that the components illustrated in FIG. 2C are merely illustrative and are not intended to limit the scope of this disclosure. More specifically, while the components in FIG. 2C are illustrated as residing within the storage device 206 of the photomask blank analyzer 130 (FIG. 2A), this is a nonlimiting example. In some embodiments, one or more of the components may reside external to the storage device 206 and/or the photomask blank analyzer 130 (FIG. 2A).

The various components, devices, and systems that generate and provide a target topographic map that is usable to finish a photomask blank such that the photomask blank has a sufficient flatness according to functional specification should now be understood. The various methods and processes for generating and providing the target topographic map will now be discussed with respect to FIGS. 3-6.

Figure 3:
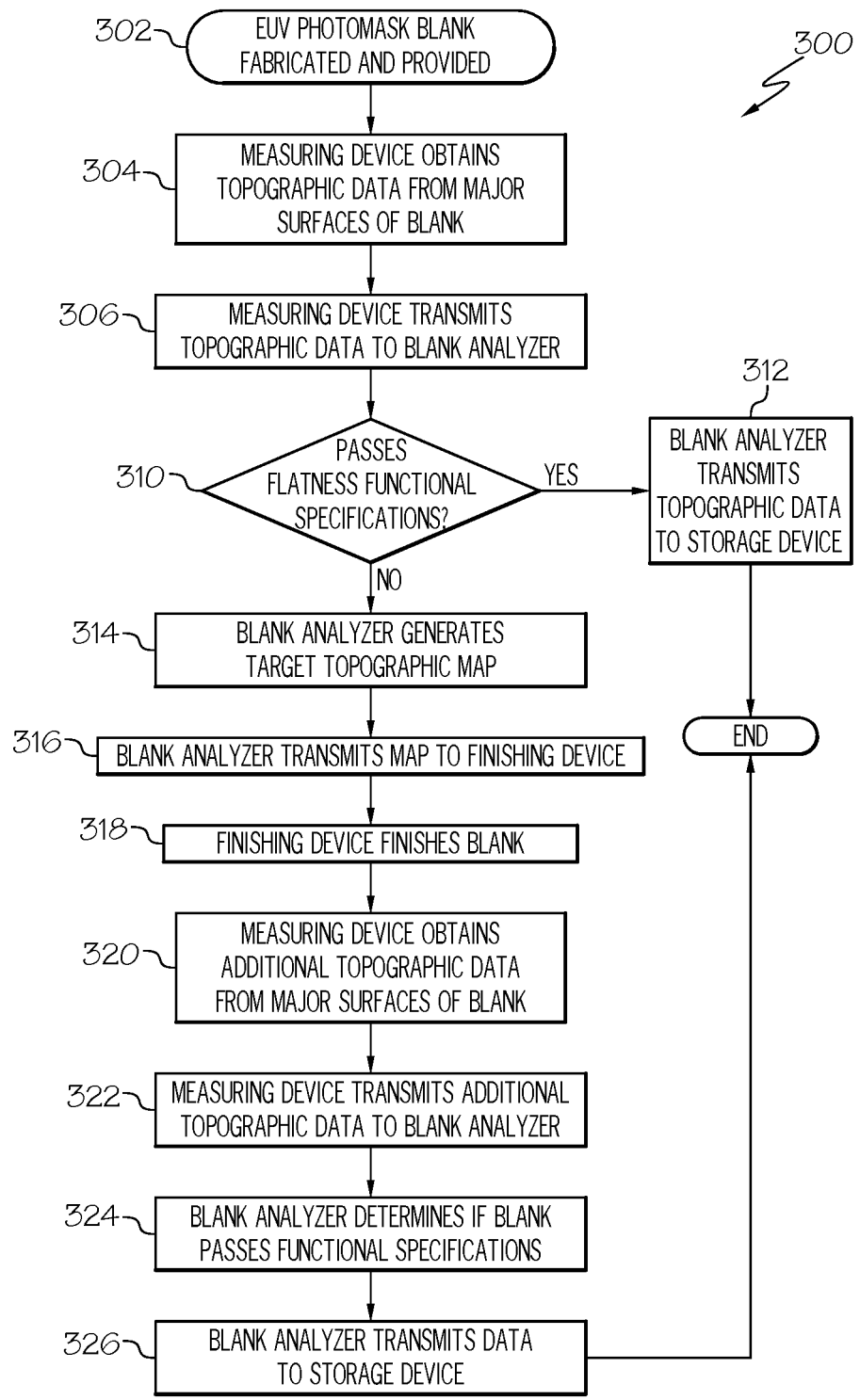
FIG. 3 depicts a flow diagram of an illustrative overview method of generating and providing a target topographic map to a finishing device for the purposes of finishing a photomask blank according to one or more embodiments shown and described herein.

FIG. 3 depicts a flow diagram of an illustrative overview method 300 of generating and providing a target topographic map that is used for the purposes of finishing a photomask blank according to various embodiments. At block 302, the EUV photomask blank is fabricated and provided. In some embodiments, the EUV photomask blank may be fabricated and/or provided by one or more third party suppliers, distributors, retailers, and/or the like. Photomask blanks fabricated and provided by various systems and devices communicatively coupled to the various components described herein is contemplated, but not described in further detail herein.

Referring to FIGS. 1 and 3, at block 304, the measuring device 170 obtains topographic data from the major surfaces of the blank. For example, the measuring device 170 may utilize any surface metrology techniques to obtain the topographic data from the major surfaces (e.g., front and back surfaces) of the photomask blank.

Referring again to FIGS. 1 and 3, the measuring device 170 transmits the topographic data to the photomask blank analyzer 130 at block 306. That is, the measuring device 170 initiates a transmission via the network 110, which is received by the photomask blank analyzer 130, using, for example, programming instructions contained within the data receiving logic 222 of the non-transitory memory component 204 (FIG. 2B), as described herein.

At block 310, the photomask blank analyzer 130 analyzes the topographic data and determines whether it passes the functional specifications based on the analyzed topographic data. That is, the photomask blank analyzer 130 reviews the topographic data for the purposes of determining a flatness of the uncompleted photomask blank. Reviewing the topographic data may include an analysis of the various peaks and valleys present on the major surfaces of the photomask blank. The analysis and determination according to block 310 may further include analyzing the major surfaces of the photomask blank to predict the out of plane distortion and/or in-plane distortion at the wafer of the photolithography system.

Out of plane distortion at the wafer of the photolithography system occurs when the image on the photomask blank (a line space pattern) is out of focus from where the illumination expects it to be. Because the photomask blank is reflective, the light traverses an additional space before it comes into contact with the photomask blank. It then reflects, and travels back to the wafer plane, but because of this shift in the photomask blank image location, the final image at the wafer is now shifted as well.

In-plane distortion at the wafer of the photolithography system occurs due to the differences in the clamping mechanisms between a write tool (e.g., a tool used to print line space patterns on the photomask blank) and the exposure tool (e.g., a tool used when holding the photomask blank for the purposes of generating the topographic data. The photomask blank has a slightly different free form shape when the image is printed, and then when it gets clamped in the exposure tool, that previously printed image can be shifted or stretched depending on the difference in its shape from print to final clamping.

Certain EUV flatness metrics that have been proposed are functional requirements, in the sense that such flatness metrics require a detailed model and calculation to evaluate. In embodiments, the clamping function of the back side of the mask is calculated using a model of the electrostatic clamping that is used to keep the photomask in place during use. One illustrative flatness metric concerns the impact of mask flatness on focus (called MFO). MFO is calculated as the largest departure from middle thickness of the clamped mask, after a linear fit is removed from the data. Two other illustrative flatness metrics (MDL and MDH) concern the impact of mask flatness on overlay. The in-plane and out-of-plane distortion that will be caused by the mask flatness at the wafer is first estimated, along with the total distortion, which is the sum of the in-plane and out-of-plane distortion. Then for one of the two overlay metrics (MDL), the total distortion is corrected by removing a linear fit from the data; for the other of two overlay metrics (MDH), the total distortion is corrected by removing a linear fit as well as certain terms in a quadratic and cubic fit to the data. For each of these overlay metrics, the reported metric is the largest distortion amount, as measured from the middle thickness of the mask and after the distortion is corrected per the fit to the data.

In some embodiments, the analysis and determination based on aspects of the topographic data of the photomask blank according to block 310 may include considering one or more factors that may contribute to flatness. The two primary factors may include (1) the thickness map of the blank when it is in a clamped state by the electrostatic clamp, and (2) the gradient of the clamping function, which is the shape of the back side of the mask that conforms to the electrostatic clamp.

Referring again to FIGS. 1 and 3, the photomask blank analyzer 130 determines whether the uncompleted photomask blank passes flatness functional specifications at block 310. That is, the photomask blank analyzer may receive data corresponding to flatness functional specifications and determine whether the uncompleted photomask blank passes the specifications. As described herein, the flatness functional specifications may be received as a transmission from a party that promulgates such specifications, may be retrieved from storage, and/or the like. The topographic data is then used to evaluate the one or more functional flatness metrics to determine whether it passes the flatness functional specifications. The topographic data may pass the flatness functional specifications if the topographic data indicates that the major surfaces of the photomask blank are flat enough to be within a range provided by the flatness functional specifications. If the uncompleted photomask blank passes flatness functional specifications (e.g., all of the major surfaces pass the flatness functional specifications), the process may proceed to block 312. If the uncompleted photomask blank does not pass flatness functional specifications (e.g., at least one major surface does not pass the flatness functional specifications), the process may proceed to block 314.

At block 312, if the major surfaces of the photomask blank pass the functional specifications, the photomask blank analyzer 130 transmits the topographic data to a storage device. In some embodiments, the topographic data may be used as a basis for a machine learning algorithm to learn particular features of topographic data that indicate a major surface that is sufficiently flat to meet flatness functional specifications. As such, in such embodiments, the topographic data may be transmitted by the photomask blank analyzer 130 to the map generation device 140 and/or to the database server 150 such that the topographic data is later accessible by the map generation device 140. Referring to FIGS. 2A and 2C, in other embodiments, the topographic data may be stored in the storage device 206 of the photomask blank analyzer 130 as a part of the topographic data 240 shown in FIG. 2C.

If the photomask blank does not pass the functional specifications, the photomask blank analyzer 130 generates a target topographic map for the major surfaces of the photomask blank that do not pass the functional specifications at block 314 and transmits the target topographic map to the finishing device 160 at block 316. As will be described in greater detail herein with respect to FIG. 4, generating the target topographic map according to block 314 is based on the topographic data and the data corresponding to the one or more functional specifications for flatness of an acceptable photomask blank. The target topographic map provides instructions that are usable by the finishing device for removing an amount of material from the major surface(s) to achieve a particular flatness that passes the functional specifications in a manner that minimizes the amount of time in which the finishing device is utilized and minimizing the amount of material that is removed from the photomask blank, while also avoiding subsequent finishing passes to ensure a sufficient flatness. As such, while the photomask blank could be "more flat" (e.g., closer to completely flat) than the bare minimum that is necessary to pass the functional specifications, achieving such a state may require subsequent finishing passes to remove more material, which takes more time and resources.

At block 318, the finishing device 160 finishes the major surfaces of the photomask blank. That is, the finishing device 160 applies one or more polishing and/or other finishing techniques necessary to remove as little material from the blank as possible that will result in the blank passing the functional specifications. In embodiments, the finishing device 160 may implement the material removal that is specified in the target topographic map. As noted herein, removing as little material as possible can be completed more quickly relative to other processes where a portion of the material is removed and the blank is re-analyzed for the purposes of determining flatness and/or more material than is necessary is removed to achieve a flatness that far exceeds what is necessary to pass the functional specifications. As a result of the process described herein, the major surfaces of the photomask blank are now highly likely to pass the flatness functional specifications and be sufficiently flat for use.

In some embodiments, it may be desirable to determine how closely the major surfaces of the photomask blank pass the flatness functional specifications based on the type of finishing device 160 used, various settings of the finishing device 160, how long the finishing device 160 is used and in what manner, and/or the like for the purposes of training the map generation device 140 to more accurately determine an amount of material to remove from future uncompleted photomask blanks to achieve completed photomask blanks. As such, the various processes described hereinafter may be used to obtain additional information that is used for machine learning purposes to determine how much material must be removed from future photomask blanks to pass the functional specifications and further minimize the amount of material that is removed. Accordingly, at block 320, the measuring device 170 may obtain additional topographic data from the major surfaces of the blank. That is, the measuring device 170 may utilize any surface metrology techniques to obtain the topographic data from the major surfaces (e.g., front and back surfaces) of the photomask blank, as described herein.

In some embodiments, the measuring device 170 may transmit the additional topographic data to the photomask blank analyzer 130 at block 322. That is, the measuring device 170 initiates a transmission via the network 110, which is received by the photomask blank analyzer 130, using, for example, programming instructions contained within the data receiving logic 222 of the non-transitory memory component 204 (FIG. 2B), as described herein. It should be understood that other periphery data, such as data pertaining to an amount of material removed, the type of device used to remove the material, one or more settings of a device used to remove the material, a length of time necessary to remove material, and/or the like, may also be transmitted according to the process of block 322 without departing from the scope of the present disclosure (e.g., the additional topographic data can be interpreted to include the other periphery data). Alternatively or in addition to completing the process according to block 322, the measuring device 170 may transmit the additional topographic data to another device, such as, for example, the map generation device 140 and/or the database server 150.

In embodiments where the data is transmitted to the photomask blank analyzer 130, the photomask blank analyzer 130 may determine if the completed photomask blank passes the functional specifications at block 324. That is, the photomask blank analyzer 130 may compare the additional topographic data received from the measuring device 170 with the data pertaining to the functional specifications and determine whether the measurements from the additional data are within the buffer range of the functional specifications. Data relating to such a determination, along with the additional topographic data, may be transmitted to a storage device (e.g., the database server 150) at block 326. In some embodiments, the data may be used as a basis for training a machine learning computer (e.g., the map generation device 140) to learn particular features of topographic data that indicate a major surface that is sufficiently flat to meet flatness functional specifications. As such, in such embodiments, the topographic data may be transmitted by the photomask blank analyzer 130 to the map generation device 140 and/or to the database server 150 such that the topographic data is later accessible by the map generation device 140. Referring to FIGS. 2A and 2C, in other embodiments, the topographic data may be stored in the storage device 206 of the photomask blank analyzer 130 as a part of the topographic data 240 shown in FIG. 2C.

Figure 4:
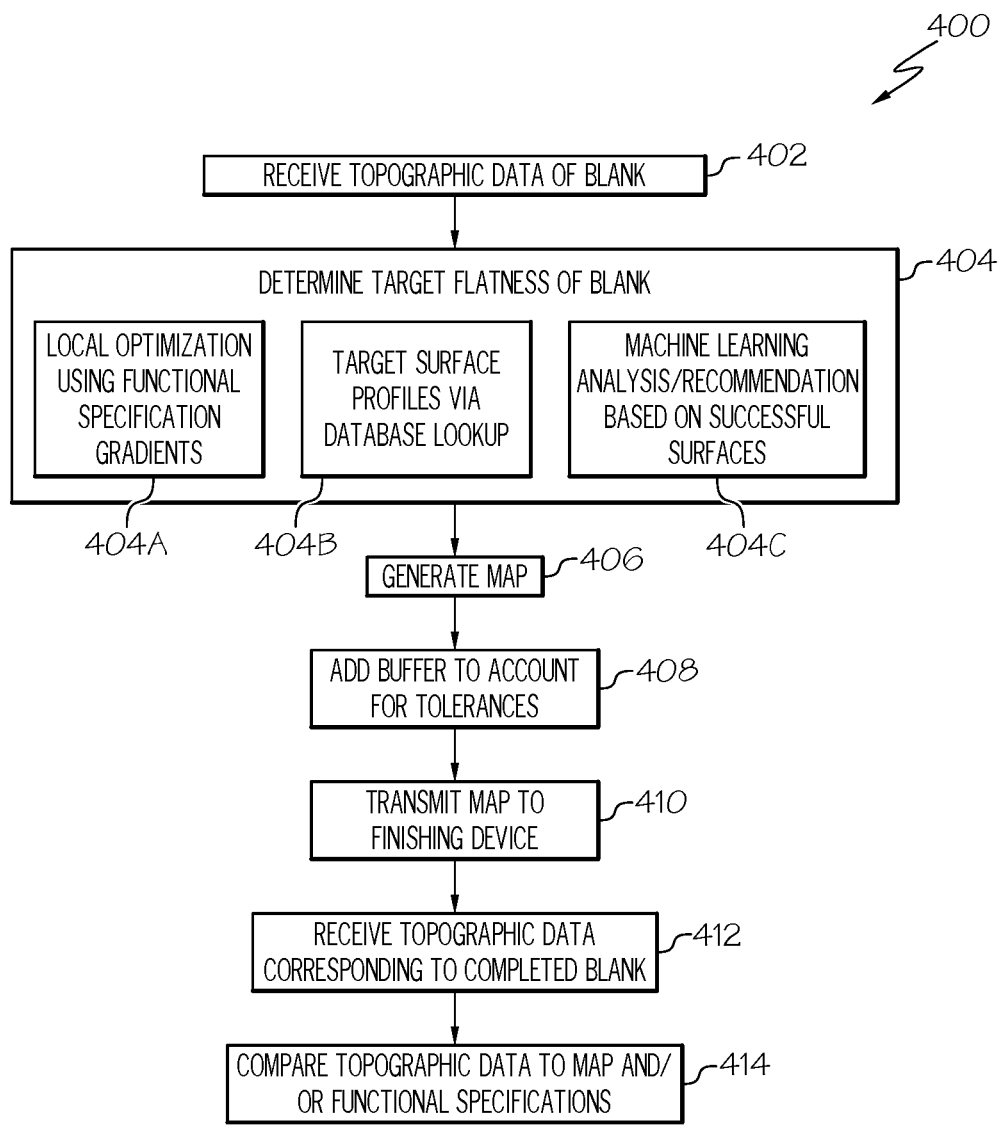
FIG. 4 depicts a flow diagram of an illustrative method executed by a photomask blank analyzer to generate a target topographic map according to one or more embodiments shown and described herein.

Additional details regarding the processes completed by the photomask blank analyzer 130 in generating a target topographic map are depicted in FIG. 4. Referring to FIGS. 1 and 4, the photomask blank analyzer 130 receives the topographic data pertaining to the blank at block 402. That is, the measuring device 170 initiates a transmission via the network 110, which is received by the photomask blank analyzer 130, using, for example, programming instructions contained within the data receiving logic 222 of the non-transitory memory component 204 (FIG. 2B), as described herein.

At block 404, a target flatness of the blank is determined by the photomask blank analyzer 130. That is, the photomask blank analyzer determines one or more locations of material removal on each of the major surfaces of the blank that would result in a blank that is sufficiently flat to pass the functional specifications for that blank. Such a determination process according to block 404 may be completed via a first (e.g., local) optimization algorithm that uses functional specification gradients as depicted at block 404a, a second optimization algorithm as depicted at block 404b, or a third optimization algorithm as depicted at block 404c. More specifically, block 404b pertains to a second optimization algorithm whereby a database is accessed for target surface profiles and block 404c pertains to a third optimization algorithm whereby the map generation device 140 is trained to analyze the blank and make a recommendation based on previous successful surfaces of blanks.

The algorithms described herein with respect to blocks 404a-404c use the language of the field of nonlinear optimization in mathematics. In a broad sense, the algorithms seek to lower the numerical values of the assessments of the functional specifications on flatness for the photomask blank, heading towards the minimum values of these specifications but stopping as soon as new shapes are identified for each of the major surfaces that will meet the functional specifications (e.g., pass the functional specifications) with some buffer that provides a high degree of confidence that the photomask blank will be compliant after a single iteration of deterministic polishing.

A step in determining the target flatness of the photomask blank according to block 404 using a framework of nonlinear optimization is to describe the shape of the front and back surfaces of the photomask blank (e.g., the "state of the photomask blank") using a series of parameters. The series of parameters may be chosen from pointwise parameters, polynomial parameters, and spatial-frequency parameters. The pointwise parameters describe the state of the photomask blank as height measurements, which is obtained from the topographic data received at block 402. The polynomial parameters include fitting the height measurements obtained from the topographic data received at block 402 for each of the major surfaces of the photomask blanks to two-dimensional polynomials that have a domain of the active area of the photomask blank. The spatial-frequency parameters include fitting the height measurements obtained from the topographic data received at block 402 for each of the major surfaces of the photomask blanks to a series of two-dimensional functions consisting of sines and cosines that are periodic over each dimension of the active area of the photomask blank. It should be understood that the spatial-frequency parameters may be referred to as a Fourier series. Within the context of nonlinear optimization, a large number of parameters may be used to describe the state of the photomask blank. For example, a photomask blank may be measured on a grid of points having about 100 measurement points or more in each direction (e.g., about 10,000 measurement points or more per major surface of the photomask blank). Polynomial and spatial-frequency parameters may provide useful representations of the photomask blank state with fewer parameters (e.g., about 50 or more parameters per major surface of the photomask blank). The list of parameters (together with the system of parameters that is used) can be viewed as a single point in a N-dimensional parameter space, where N is the total number of the parameters being used. Each other point in the N-dimensional parameter space represents some other shape of the major surfaces of the photomask blank. Determining a target topographic map for deterministic finishing that will meet all the functional specifications may be viewed as moving around in the N-dimensional parameter space. The target topographic map is related to the difference in location between a final point and an initial point.

As described in greater detail herein, the algorithms according to blocks 404a-404c can either identify a direction to explore in the parameter space, where the algorithms can move along until all functional specifications are met, or identify a final point in the parameter space that is known to satisfy all functional specifications and move in a straight line between a current point and the final point, investigating intermediate points.

The determining process according to block 404 includes converting the topographic data (e.g., surface measurements for each of the major surfaces of the blank) are converted into a series of parameters (e.g. pointwise parameters, polynomial parameters, and/or spatial-frequency parameters). In addition, the determining process according to block 404 includes discovering a "nearby" point in the parameter space that meets all of the functional specifications and has some amount of "buffer" added in such that the mask polisher's particular methods and best practices of deterministic polishing can be added in to give a high probability that the photomask blank will be made compliant with the specifications in a single iteration.

The local optimization algorithm according to block 404a may generally make use of a gradient (e.g., the partial derivatives of the functional specifications with respect to all the parameters describing the first major surface and the second major surface of the photomask blank). The local optimization algorithm according to block 404a proceeds through the N-dimensional parameter space in a direction related to the gradient, until a new state of the major surfaces of the blank that would then satisfy all functional specifications is discovered. In some embodiments, the local optimization algorithm according to block 404 may utilize programming instructions contained within the gradient determining logic 234 of the non-transitory memory component 204 (FIG. 2B) of the photomask blank analyzer 130. Still referring to FIGS. 1 and 4, the resulting target topographic map is a difference between a new state and a current state of the mask surfaces. Since there are multiple functional specifications, each of which has a gradient with respect to all of the parameters, the actual directions explored can be related to the gradient of each functional specification in turn, or a combination of all of these gradients into a single direction of exploration. These gradients can be computed via a numerical process or via an analytic process. In a numerical process, the functional specifications are evaluated repeatedly, while systematically introducing small changes to each parameter or component in turn. The partial derivative of a functional specification with respect to a given parameter is the change in the specification divided by the change systematically introduced in the parameter. In an analytic process, the partial derivatives of the functional specifications with respect to surface parameters are evaluated using, for example, the methods of reverse-mode algorithmic differentiation.

The algorithm that accesses a database according to block 404*b* generally includes comparing, for a particular photomask blank being polished, the current state of the photomask blank (that is, its point in the N-dimensional parameter space) with the states of all of the successful photomask blanks in a database (e.g., successful photomask blank related data stored within the storage device 206 (FIG. 2A) of the photomask blank analyzer 130, successful photomask blank related data stored within the database server 150, and/or the like). Still referring to FIGS. 1 and 4, data pertaining to each successful photomask blank that would be obtained only by removing material from the current state represents a possible target state for the optimization. The parameter-space direction identified from a path that connects the current state and each viable database state can be evaluated for possible target topographic maps, evaluating the functional specifications along the way. Since each point in the N-dimensional parameter space represents a state of a possible photomask blank, the notion of a path connecting two points in the parameter space is a mathematical abstraction but is understood in analogy to the points and paths that exist in the three-spatial-dimension world. The "origin state" of perfectly flat major surfaces is also an option that is included within the data pertaining to successful photomask blanks, so the "origin state" is always available as a possibility within the database. Assuming that multiple database entries represent viable target states for the optimization, each one may be evaluated such that a selected target topographic map provided as a result of executing the process according to block 404*b* (e.g., selecting a topographical map from the database) corresponds to a topographical map that minimizes time and/or other resources needed to achieve a completed photomask blank, as described herein.

The optimization algorithm that utilizes a trained map generation device according to block 404*c* generally includes directing the map generation device 140 to analyze databases containing information pertaining to surface measurements of the compliant photomask blanks and identify correlations in the information that may not be readily apparent to individuals with access to the same data. The algorithms contained within the map generation device 140 can be trained to look for patterns in what separates compliant versus uncompliant photomask blank states (e.g., photomask blanks that pass or do not pass functional specifications) and to identify the "closest" compliant state, for the purposes of identifying a target topographic map. "Closest" as used herein refers to a state that minimizes an amount of time and/or other resources necessary to implement the new shapes of the surfaces.

It should be understood that, for a given state of a photomask blank, there may be a plurality of options for how to improve the surfaces in order to bring the photomask blank in compliance with the functional specifications, that are optimal or near optimal. As an example, if a photomask blank is too thick at one point on the mask, there are likely viable solutions that involve removing some material around that point from a first major surface thereof, a second major surface thereof, or both the first major surface and the second major surface. The determining process according to block 404 can determine among equal or near-equal options in a variety of ways, including, but not limited to, i) considering all or many options and observing each option through to a final target topographic map of the surfaces. The implementation of all of the target topographic maps can be evaluated and/or simulated and a final recommendation can be selected; ii) use a preprogrammed experience with the measurement and fabrication of a photomask blank and the intent of the functional specifications, which may provide heuristics pertaining to particular strategies in deterministic finishing that are more likely to be successful; and/or iii) generate one or more decisions among options while considering a buffer, as described herein.

As a result of the process described with respect to block 404 (including the processes according to blocks 404*a*, 404*b*, and 404*c*), a target topographic map is generated at block 406. That is, referring to FIGS. 1, 2B, and 4, the photomask blank analyzer 130 utilizes the topography analysis logic 228 and/or the map generation logic 230 to select a target topographic map that is expected to result in a polishing process that removes material from the photomask blank in such a manner to minimize the amount of time and/or resources necessary to bring the photomask blank into compliance with the functional specifications (e.g., such that the photomask blank passes the functional specifications). As described herein, the target topographic map generated by the photomask blank analyzer in accordance with block 406 and as a result of the process described herein with respect to block 404, represents data, information, and/or instructions that are usable by the finishing device 160 for removing an amount of material from the first major surface and/or the second major surface of the uncompleted photomask blank such that the first major surface and the second major surface achieve a flatness that passes each of the one or more functional specifications for flatness. In addition, the amount of material removed may reflect a minimum amount of material necessary to pass the one or more functional specifications.

Referring again to FIGS. 1 and 4, since an intended surface change of each of the major surfaces of the photomask blank may differ from an actual surface change (e.g., due to inherent characteristics of the finishing device 160, particular materials used by the finishing device 160, finishing techniques utilized by the finishing device 160, and/or the like), it may be necessary to introduce a buffer that accounts for this variation between the intended surface change and the actual surface change. As such, at block 408, a buffer may be added to account for tolerances.

In some embodiments, determining an amount of buffer to be added according to block 408 may be completed based on a previous experience with deterministic polishing (e.g., using magnetorheological finishing (MRF) or ion-beam milling) to offer an initial estimate for the accuracy of these deterministic polishing methods and the properties of the gaps between intended and actual surface changes. However, a photomask-blank polisher (e.g., the finishing device 160) may use different deterministic polishing methods or may have different best practices for these methods, which could lead to estimates of reasonable buffers being too small or too large. Accordingly, in some embodiments, the map generation device 140 may be utilized to refine buffer predictions as new data is generated and provided (e.g., as each of a plurality of photomask blanks is analyzed, topographic data is generated, a target topographic map is generated, and the finishing device 160 finishes the blank accordingly): If the finishing device 160 inputs initial shapes, the intended changes, and the final shapes of surfaces under a deterministic polishing process to the database server 150 for access by the map generation device 140 (or directly to the map generation device 140), over time, the statistics obtained from the data would allow the map generation device 140 to refine predictions of an appropriate buffer. That is, the map generation device 140 may use a Markov chain or a Kalman filter, or adaptive machine learning algorithms, to refine the predictions of an appropriate buffer.

At block 410, the target topographic map with the additional buffer is transmitted to the finishing device 160 for the purposes of utilizing a finishing technique according to the target topographic map and the added buffer to achieve a completed photomask blank, as described herein. That is, the photomask blank analyzer 130 initiates a transmission via the network 110, which is received by the finishing device 160, using, for example, programming instructions contained within the transmitting logic 226 of the non-transitory memory component 204 (FIG. 2B), as described herein. It should be understood that the transmission directs operation of the finishing device 160 to finish one or more of the major surfaces of the photomask blank with the intention of causing the photomask blank to comply with the one or more functional specifications (e.g., pass the one or more functional specifications) without the need for subsequent passes and/or measuring steps. The photomask blank, once polished according to the target topographic map and the buffer, may be referred to as a completed photomask blank.

Still referring to FIGS. 1 and 4, to ensure that the map generation device 140 continues to be more accurately trained for the purposes of determining a target flatness of the blank (e.g., according to block 404c) and/or generating a target topographic map (e.g., according to block 406), topographic data corresponding to the completed photomask blank may be received at block 412 and compared with the target topographic map and/or the functional specifications at block 414. That is, the measuring device 170 may obtain topographic data from the major surfaces of the completed photomask blank and may transmit the topographic data to the photomask blank analyzer 130. For example, the measuring device 170 may utilize any surface metrology techniques to obtain the topographic data from the major surfaces (e.g., front and back surfaces) of the completed photomask blank and may then initiate a transmission via the network 110, which is received by the photomask blank analyzer 130, using, for example, programming instructions contained within the data receiving logic 222 of the non-transitory memory component 204 (FIG. 2B), as described herein. Further, the photomask blank analyzer 130, utilizing programming instructions contained in one or more modules of the non-transitory memory component 204 (FIG. 2A) thereof (e.g., the conversion logic 224, the topography analysis logic 228, the map generation logic 230, and/or the gradient determining logic 234 (FIG. 2B)) may compare the actual amount of material that was removed from the major surface(s) of the photomask blank (e.g., by analyzing the topographic data) with an expected amount of material to be removed based on the target topographic map and/or comparing the topographic data of the completed photomask blank with the functional specifications to determine whether the completed photomask blank complies with the functional specifications (e.g., passes the functional specifications). This information can be used by the map generation device 140 for further training for the purposes of future topographic map generation and/or future buffer determination.

It should now be understood that the embodiments described herein generally relate to devices, systems, and methods of generating a target topographic map that is usable by a finishing device in a process of completing a photomask blank such that the completed photomask blank complies with one or more flatness functional specifications. More specifically, the devices, systems, and methods described herein generate topographic data of an uncompleted photomask blank, determine and generate the target topographic map that will result in the uncompleted photomask blank complying with the one or more functional specifications, and removing material according to the target topographic map to achieve the completed photomask blank in a manner that minimizes an amount of time and/or other resources in removing material. As a result of the processes described herein, it is unnecessary to complete successive polishing passes on the major surfaces of a photomask blank to achieve a completed blank that complies with functional specifications.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method of generating a target topographic map for a finishing device to use on a photomask blank, the method comprising:
   receiving, by a processing device, topographic data corresponding to an uncompleted photomask blank, the topographic data including an imaged topography of a first major surface of the uncompleted photomask blank and an imaged topography of a second major surface of the uncompleted photomask blank;
   receiving, by the processing device, data corresponding to one or more functional specifications for flatness of an acceptable completed photomask blank;
   generating, by the processing device, the target topographic map for at least one of the first major surface and the second major surface based on the topographic data and the data corresponding to the one or more functional specifications for flatness of the acceptable completed photomask blank, the target topographic map providing instructions for removing an amount of material from at least one of the first major surface and the second major surface of the uncompleted photomask blank such that the first major surface and the second major surface achieve a flatness that passes each of the one or more functional specifications for flatness, wherein the amount of material removed reflects a reduction in an amount of material necessary to pass the one or more functional specifications; and
   transmitting, by the processing device, the target topographic map to the finishing device such that the finishing device utilizes a finishing technique to implement changes to the uncompleted photomask blank according to the target topographic map by removing the amount of material from the uncompleted photomask blank to achieve a completed photomask blank that passes each of the one or more functional specifications for flatness.

2. The method of claim 1, further comprising, after transmitting the target topographic map:

receiving, by the processing device, second topographic data of the completed photomask blank;

determining, by the processing device, whether the second topographic data of the completed photomask blank passes each of the one or more functional specifications for flatness; and transmitting, by the processing device, data corresponding to whether the second topographic data of the completed photomask blank passes each of the one or more functional specifications for flatness and the target topographic map to a storage device.

3. The method of claim 1, further comprising converting, by the processing device, the topographic data into a plurality of parameters in a parameter space.

4. The method of claim 3, wherein generating the target topographic map comprises utilizing a local optimization algorithm to generate the target topographic map.

5. The method of claim 4, wherein utilizing the local optimization algorithm comprises:

determining, by the processing device, a gradient of each of the one or more functional specifications with respect to the plurality of parameters;

traversing, by the processing device, the parameter space in a direction relating to the gradient until a state that satisfies the one or more functional specifications is found; and generating, by the processing device, the target topographic map such that the target topographic map reflects a difference between the state and a current state of the uncompleted photomask blank.

6. The method of claim 5, wherein determining the gradient comprises repeatedly evaluating the one or more functional specifications while systematically introducing changes to each parameter of the plurality of parameters.

7. The method of claim 1, wherein generating the target topographic map comprises utilizing an optimization algorithm to generate the target topographic map.

8. The method of claim 7, wherein utilizing the optimization algorithm comprises:

determining, by the processing device, a target surface profile of each of the first major surface and the second major surface via a lookup of a database comprising a plurality of target surface profiles; and generating, by the processing device, the target topographic map such that the target topographic map corresponds to the target surface profile of each of the first major surface and the second major surface.

9. The method of claim 7, wherein utilizing the optimization algorithm comprises:

receiving, by the processing device, one or more specifications of the first major surface and the second major surface from a map generation device trained to determine differences between a compliant photomask blank state and an uncompliant photomask blank state and determine a most compliant state, wherein the most compliant state is a state that minimizes an amount of time and resources needed to finish the uncompleted photomask blank; and generating, by the processing device, the target topographic map such that the target topographic map corresponds to the one or more specifications.

10. The method of claim 1, wherein the target topographic map includes a buffer corresponding to an amount of extra material that, if removed from at least one of the first major surface and the second major surface of the uncompleted photomask blank, increases a likelihood that the uncompleted photomask blank can be made compliant with the functional specifications with a single iteration of deterministic polishing.

11. The method of claim 10, wherein the buffer is determined by a map generation device trained to determine a mismatch between material intended to be removed and material removed in practice from a particular type of finishing device.

12. The method of claim 1, wherein receiving the topographic data corresponding to the uncompleted photomask blank comprises receiving one or more pointwise parameters describing a state of the uncompleted photomask blank.

13. The method of claim 1, wherein receiving the topographic data corresponding to the uncompleted photomask blank comprises receiving one or more polynomial parameters, the one or more polynomial parameters comprising one or more height measurements fit to two-dimensional polynomials comprising a domain corresponding to an active area of the uncompleted photomask blank.

14. The method of any one of claim 1, wherein receiving the topographic data corresponding to the uncompleted photomask blank comprises receiving one or more height measurements fit to a plurality of two-dimensional functions comprising sines and cosines that are periodic over each dimension of an active area of the uncompleted photomask blank.

15. The method of any one of claim 1, wherein receiving the topographic data comprises receiving the topographic data from a surface metrology instrument.

16. The method of claim 1, wherein the data corresponding to the one or more functional specifications for flatness of the acceptable completed photomask blank are promulgated by a body that determines an acceptable flatness of particular photomask blanks.

17. A system for processing photomask blanks, the system comprising:

a measuring device;

a finishing device; and a photomask blank analyzer communicatively coupled to the measurement device and the finishing device, the photomask blank analyzer configured to:

receive topographic data corresponding to an uncompleted photomask blank from the measuring device, the topographic data including an imaged topography of a first major surface of the uncompleted photomask blank and an imaged topography of a second major surface of the uncompleted photomask blank;

receive data corresponding to one or more functional specifications for flatness of an acceptable completed photomask blank;

generate a target topographic map for at least one of the first major surface and the second major surface based on the topographic data and the data corresponding to the one or more functional specifications for flatness of the acceptable completed photomask blank, the target topographic map providing instructions for removing an amount of material from at least one of the first major surface and the second major surface of the uncompleted photomask blank such that the first major surface and the second major surface achieve a flatness that passes each of the one or more functional specifications for flatness, wherein the amount of material removed reflects a reduction in an amount of material necessary to pass the one or more functional specifications; and transmit the target topographic map to the finishing device, wherein the finishing device utilizes a finishing technique to implement changes to the uncompleted photomask blank according to the target topographic map by removing the amount of material from the uncompleted photomask blank to achieve a completed photomask blank that passes each of the one or more functional specifications for flatness.

18. The system of claim 17, further comprising a database server communicatively coupled to the photomask blank analyzer, the database server comprising at least one of: (a) the data corresponding to the one or more functional specifications for flatness of the acceptable completed photomask blank or (b) a plurality of target surface profiles.

19. The system of claim 18, wherein the photomask blank analyzer is further configured to:
  determine a target surface profile of each of the first major surface and the second major surface via a lookup of the plurality of target surface profiles; and
  generate the target topographic map such that the target topographic map corresponds to the target surface profile of each of the first major surface and the second major surface.

20. The system of claim 17, further comprising a map generation device communicatively coupled to the photomask blank analyzer, the map generation device trained to at least one of: (a) determine differences between a compliant photomask blank state and an uncompliant photomask blank state and determine a most compliant state, the most compliant state being a state that minimizes an amount of time and resources needed to finish the uncompleted photomask blank or (b) determine amounts of extra material typically removed from a particular type of finishing device.

* * * * *